United States Patent
Yanagidaira et al.

(10) Patent No.: US 7,952,958 B2
(45) Date of Patent: May 31, 2011

(54) NON-VOLATILE SEMICONDUCTOR STORAGE SYSTEM

(75) Inventors: Kosuke Yanagidaira, Fujisawa (JP); Toshihiro Suzuki, Kawasaki (JP); Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 12/507,366

(22) Filed: Jul. 22, 2009

(65) Prior Publication Data

US 2010/0034025 A1 Feb. 11, 2010

(30) Foreign Application Priority Data

Aug. 7, 2008 (JP) ................. 2008-204591

(51) Int. Cl.
*G11C 8/00* (2006.01)
(52) U.S. Cl. ......... 365/233.19; 365/185.22; 365/185.09; 365/218; 365/185.29
(58) Field of Classification Search ............ 365/185.22, 365/185.09, 233.19, 218, 185.29, 233.17, 365/233.16
See application file for complete search history.

(56) References Cited

U.S. PATENT DOCUMENTS

| | | | | |
|---|---|---|---|---|
| 5,544,119 A | * | 8/1996 | Wells et al. | ............... 365/185.11 |
| 7,305,596 B2 | | 12/2007 | Noda et al. | |
| 7,317,636 B2 | | 1/2008 | Ide et al. | |
| 2008/0106946 A1 | | 5/2008 | Inoue et al. | |

FOREIGN PATENT DOCUMENTS

| | | |
|---|---|---|
| JP | 11-134884 | 5/1999 |
| JP | 2002-208286 | 7/2002 |
| JP | 2006-012367 | 1/2006 |
| JP | 2008-544435 | 12/2008 |
| JP | 2009-503726 | 1/2009 |
| KR | 10-0407572 | 12/2003 |
| KR | 10-2006-0054374 | 5/2006 |
| KR | 10-2008-0019713 | 3/2008 |
| KR | 10-2008-0020443 | 3/2008 |
| WO | WO 2006/138333 | 12/2006 |
| WO | WO 2007/018983 | 2/2007 |

OTHER PUBLICATIONS

Office Action issued Jan. 7, 2011 in Korean Application No. 10-2009-72214 (w/English translation).
Office Action issued Feb. 22, 2011 in Japanese Application No. 2008-204591 filed Aug. 7, 2008 (w/English translation).

* cited by examiner

*Primary Examiner* — Huan Hoang
*Assistant Examiner* — Jason Lappas
(74) *Attorney, Agent, or Firm* — Oblon, Spivak, McClelland, Maier & Neustadt, L.L.P.

(57) ABSTRACT

There is provided a non-volatile memory having electrically rewritable non-volatile memory cells arranged therein. A controller controls operation at the non-volatile memory. The non-volatile memory comprises a status output section configured to output status information indicating a status of read operation, write operation or erase operation in the non-volatile memory cell. The controller comprises a control signal generating section configured to output a control signal for a certain operation in the non-volatile memory, and a control signal switching section configured to instruct the control signal generating section to switch the control signal based on the status information.

29 Claims, 9 Drawing Sheets

NON-VOLATILE SEMICONDUCTOR STORAGE SYSTEM

CROSS REFERENCE TO RELATED APPLICATIONS

This application is based on and claims the benefit of priority from prior Japanese Patent Application No. 2008-204591, filed on Aug. 7, 2008, the entire contents of which are incorporated herein by reference.

BACKGROUND OF THE INVENTION

1. Field of the Invention

This invention relates to a non-volatile semiconductor storage system that is electrically rewritable.

2. Description of the Related Art

As an example of a storage medium that can store data in a non-volatile manner, a NAND type flash memory is known.

A cell array of a NAND flash memory is composed of NAND cell units each having a plurality of memory cells connected in series. Each of the NAND cell units has both ends each of which is connected to a bit line or a source line through a selection gate transistor.

Control gates of the memory cells in the NAND cell unit are connected to different word lines, respectively. In a NAND flash memory, a plurality of memory cells share source regions and drain regions, and are connected in series. Also, the plural memory cells share a selection gate transistor, a bit line contact and a source line contact. Accordingly, a size per a unit memory cell can be reduced.

Furthermore, since a word line and a device region of memory cells are formed to have a shape of a simple stripe, the NAND flash memory is easy to be miniaturized. Thus, a flash memory having a large capacity is realized. In recent years, such a NAND flash memory is used in so-called SSD (Solid-State-Drive), and is expected as a large-capacitance storage device that may substitute hard disk drives in personal computers or the like.

By the way, when data write or data erase is repeatedly conducted to a memory cell many times, charges trapped in a charge accumulation film of the memory cell gradually become hard to flow out. In that case, even if an erase operation is repeated the same number of times as before, a threshold voltage of the memory cell does not easily drop. On the other hand, in a write operation, the threshold voltage of the memory cell may easily be raised. Therefore, the difference in the number of data write/erase operation may cause variation in cell characteristic among the memory cells, thus decreasing the reliability thereof. This problem becomes more serious as the memory cell is further miniaturized.

In view of such a problem, the JP 2008-47273A discloses a control circuit for managing, per block or per page, a state of deterioration in characteristic of a memory cell that depends on the number of data erase/data write therefor.

However, for example, providing such a control circuit per memory chip will cause high cost of these memory chips and increase the chip area.

SUMMARY OF THE INVENTION

In an aspect the present invention provides a non-volatile semiconductor memory system comprising: a non-volatile memory comprising a memory cell array with electrically-rewritable non-volatile memory cells arranged therein; and a controller configured to control operation in the non-volatile memory, the non-volatile memory comprising a status output section configured to output status information indicating a status of read operation, write operation or erase operation in the non-volatile memory cell, the controller comprising a control signal generating section configured to output a control signal for a certain operation in the non-volatile memory, and a control signal switching section configured to instruct the control signal generating section to switch the control signal based on the status information.

BRIEF DESCRIPTION OF THE DRAWINGS

FIG. 4 shows a structure of the page buffer circuit 2a.

DETAILED DESCRIPTION OF THE EMBODIMENTS

Then, embodiments of the present invention are described in detail with reference to the drawings.

First Embodiment

Figure 1:
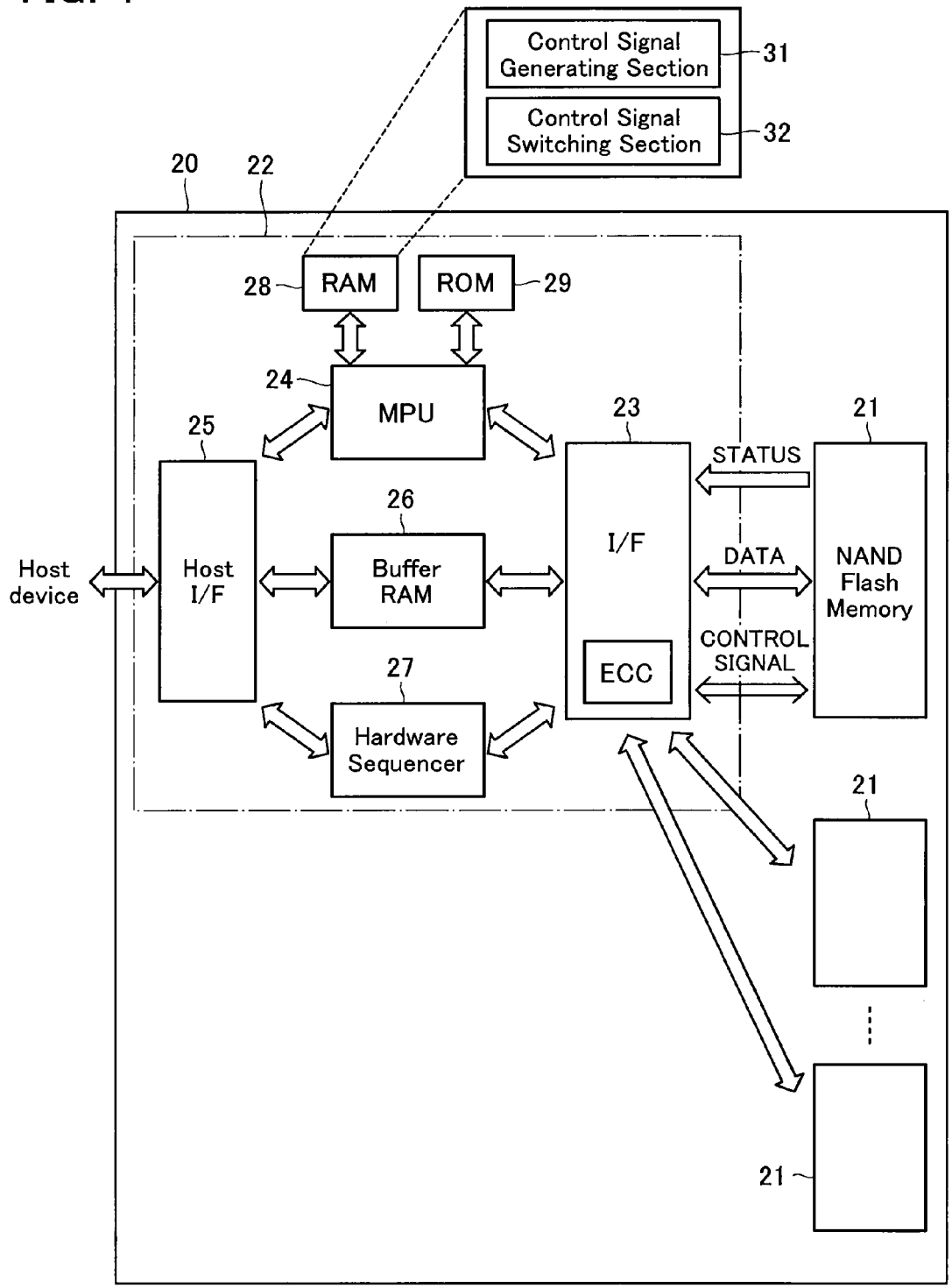
FIG. 1 is a block diagram showing a structure of the memory card 20 to which a non-volatile semiconductor storage system according to the first embodiment of the present invention is applied.

FIG. 1 shows a structure of the memory card 20 to which a non-volatile semiconductor storage system according to the first embodiment of the present invention is applied. However, the present invention may be applied not only to a memory card and but also to a mobile telephone terminal, SSD, a music player, and the like.

The memory card 20 comprises a module which is composed of a NAND flash memory chip 21 (which may be simply called the memory chip 21 hereinafter) and a memory controller 22 for controlling the read/write thereof.

The NAND flash memory chip 21 may be composed of single memory chip, or a plurality of memory chips. FIG. 1 shows a case that it is composed of a plurality of memory chips. Even in this case, the plurality of memory chips may be controlled by a single controller 22.

The memory chip 21 transfers or receives various types of control signals, read data, write data, and the like to and from the memory controller 22.

The memory controller 22 controls the memory chip 21 from outside thereof, and supplies or receives commands, addresses, and data via input/output terminals I/O0-I/O7.

In addition, the memory chip 21 transmits status information indicating a status of the memory cell relating to erase, write and read operations thereof. The memory controller 22 controls the memory chip 21 according to this status information.

The memory controller 22 is one chip controller which comprises: a NAND flash interface 23 for transferring data with the memory chip 21; a host interface 25 for transferring data with a host device (not shown); a buffer RAM 26 for temporarily holding read/write data and the like; an MPU 24 for controlling an operation of the entire memory card as well as data transfer; a hardware sequencer 27 used for a read/write sequence control and the like of firmware (FW) in the NAND flash memory chip 21; a RAM 28; and a ROM 29.

When power is supplied to the memory card 20, an initializing operation (power on/initial set-up operation) is executed to automatically read out the firmware (control program) stored in the memory chip 21, and the firmware is transferred to the RAM 28 that serves as a data register. The read-out control is executed by the hardware sequencer 27.

The firmware loaded on the RAM 28 allows the MPU 24 to create various tables on the RAM 28, a control signal generating section 31, a control signal switching section 32 and the like on the RAM 28. The control signal generating section 31 serves to generate control signals, while the control signal switching section 32 serves to switch the control signals according to the above-described status signal.

Moreover, the MPU 24 receives the command from the host, and accesses to the flash memory chip 21 and performs a transfer control. Note that an ECC circuit for conducting an error detection and error correction of the read data from the memory chip 21 is provided in the memory controller 22.

Figure 2:
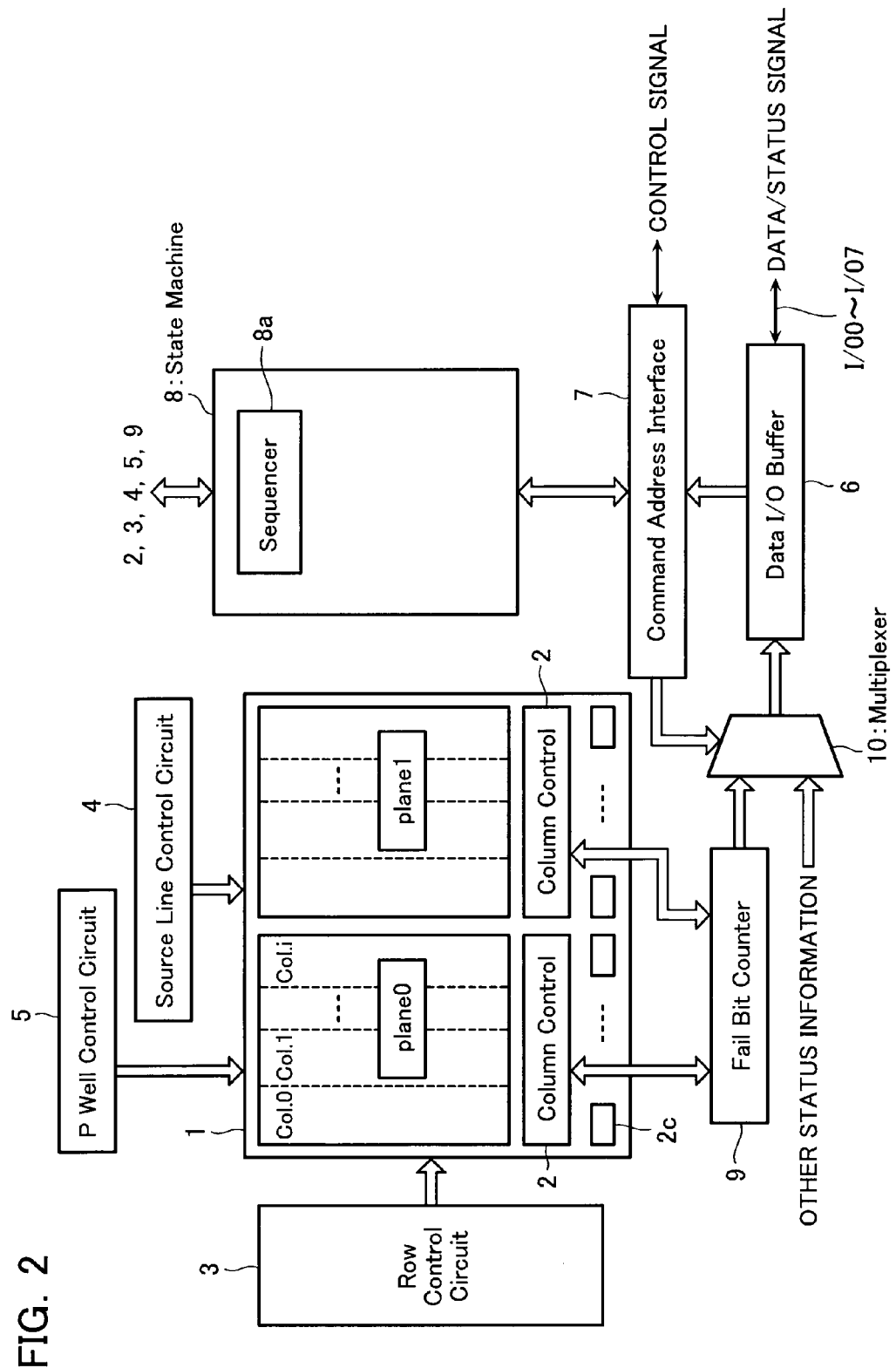
FIG. 2 is a block diagram illustrating functional block structure of the NAND type flash memory chip 21 according to the first embodiment of the present invention.
Figure 3:
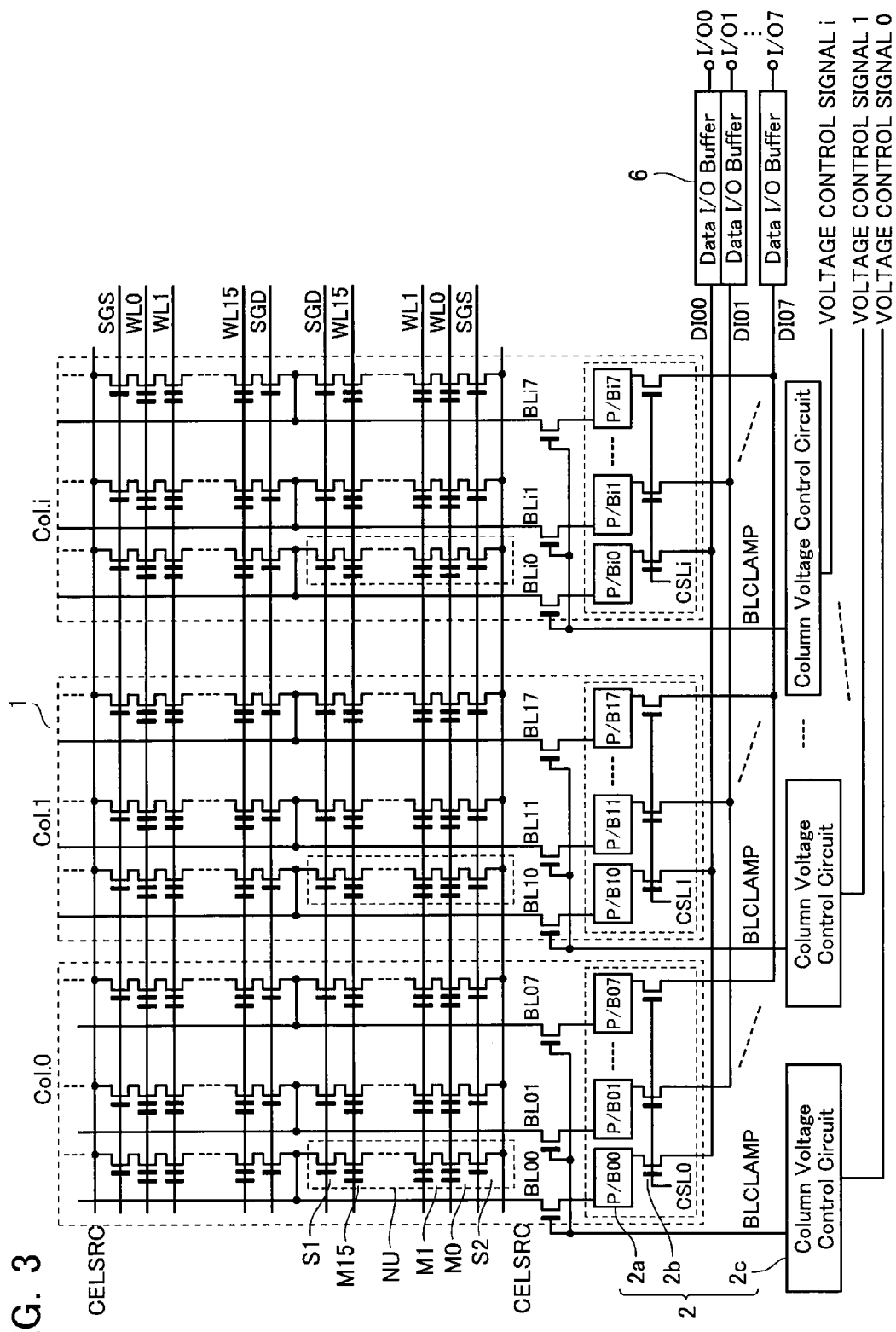
FIG. 3 shows a structure of the memory cell array 1 and the column control circuit 2 in FIG. 2.

FIG. 2 shows a functional block structure of the NAND type flash memory chip 21 according to this embodiment of the present invention. FIG. 3 shows a structure of a memory cell array 1 and a column control circuit 2.

As shown in FIG. 2, this NAND type flash memory chip 21 comprises: a memory cell array 1; a column control circuit 2; a row control circuit 3; a source line control circuit 4; P well control circuit 5; a data input/output buffer 6; a command address interface 7; a state machine 8; a fail bit counter 9; and a multiplexer 10.

The memory cell array 1 explained herein includes plural memory planes Plane that may be independently controlled. It is assumed here that the memory cell array 1 includes two planes Plane1 and Plane2. Furthermore, one memory plane Plane includes a plurality of columns Col.i.

The column control circuit 2 is connected to bit lines BL of the memory cell array 1, and drives the bit lines BL for data reading and data write. Note that the column control circuit 2 comprises column voltage control circuits 2c each of which is provided corresponding to each of the columns Col.i.

The column voltage control circuit 2c controls various voltages that are supplied to each of the columns Col.i depending on a voltage control signal set independently for each of the columns Col.i.

The row control circuit 3 is connected to word lines WL, and selection gate lines S1, S2 of the memory cell array 1 to drive them.

The source line voltage control circuit 4 performs a voltage control for a common source line CELSRC in the memory cell array 1, depending on a performance mode.

The P well voltage control circuit 5 performs the voltage control for a p-well in which the memory cell array 1 is formed, depending on a performance mode.

The data input/output buffer 6 temporarily stores data transferred from the outside for data write, and supplies the data to the column control circuit 2. Also, the data input/output buffer 6 has a function of temporarily storing data read from the column control circuit 2. The command address interface 7 receives a command provided through an input and output terminal based on the control signal supplied from the memory controller 22. The command address interface 7 transfers the command to a state machine 8 that serves as an internal controller.

The command address interface 7 receives a status output command from the memory controller 22. This allows status information of the memory cell to be supplied to the memory controller 22. The multiplexer 10 receives an internal chip status signal such as the number of fail bits from the fail bit counter 9, and receives a signal from the command address interface 7 as a selection control signal. The multiplexer 10 selects the internal chip status signal depending on a value of the selection control signal, and outputs the selected internal chip status signal to the memory controller 22 through the data input/output buffer 6.

The state machine 8 decodes a command supplied from command address interface 7, and performs an operation control indicated in the command. Specifically, the state machine 8 distinguishes, based on the command, address data and writing data both provided from an input/output terminal. Then, it performs a transfer control. Specifically, it performs transfer control so that write data is transferred to the page buffer circuit 2a corresponding to the column address data. It also performs transfer control so that row address data is transferred to the row control circuit 3. The state machine 8 also performs operation control for data write, read and erase with a sequencer 8a.

The memory cell array 1 is configured by arranging NAND cell units NU, as shown in FIG. 3. Each NAND cell unit NU has plural (in FIG. 3, sixteen) non-volatile memory cells M0-M15 that are connected in series. Each of the memory cells is electrically rewritable.

The NAND cell unit NU has both ends connected to a bit line BLij and a common source line CELSRC through a select transistor S1 or S2, respectively. The memory cells M0-M15 in the NAND cell unit NU each has a control gate connected to a word line WL0-WL15, respectively. The select transistors S1 and S2 each has a gate connected to a selection gate line SGD or SGS, respectively.

A group of the memory cells arranged along one word line configures one or two pages as a unit of data read and data write. Moreover, a group of the NAND cell units arranged along one word line configures one block which is usually dealt as a unit of the data erasure.

As shown in FIG. 3, the column control circuit 2 includes a sense amplifier/data hold circuit 2a (referred to as a page buffer circuit hereinbelow) and a column gate circuit 2b. The page buffer circuit 2a is connected to the bit line BLij arranged in the memory cell array 1 to perform data read and data write. The page buffer circuit 2a comprises a sense amplifier/register P/Bij that holds read data or write data of one page.

Figure 4:
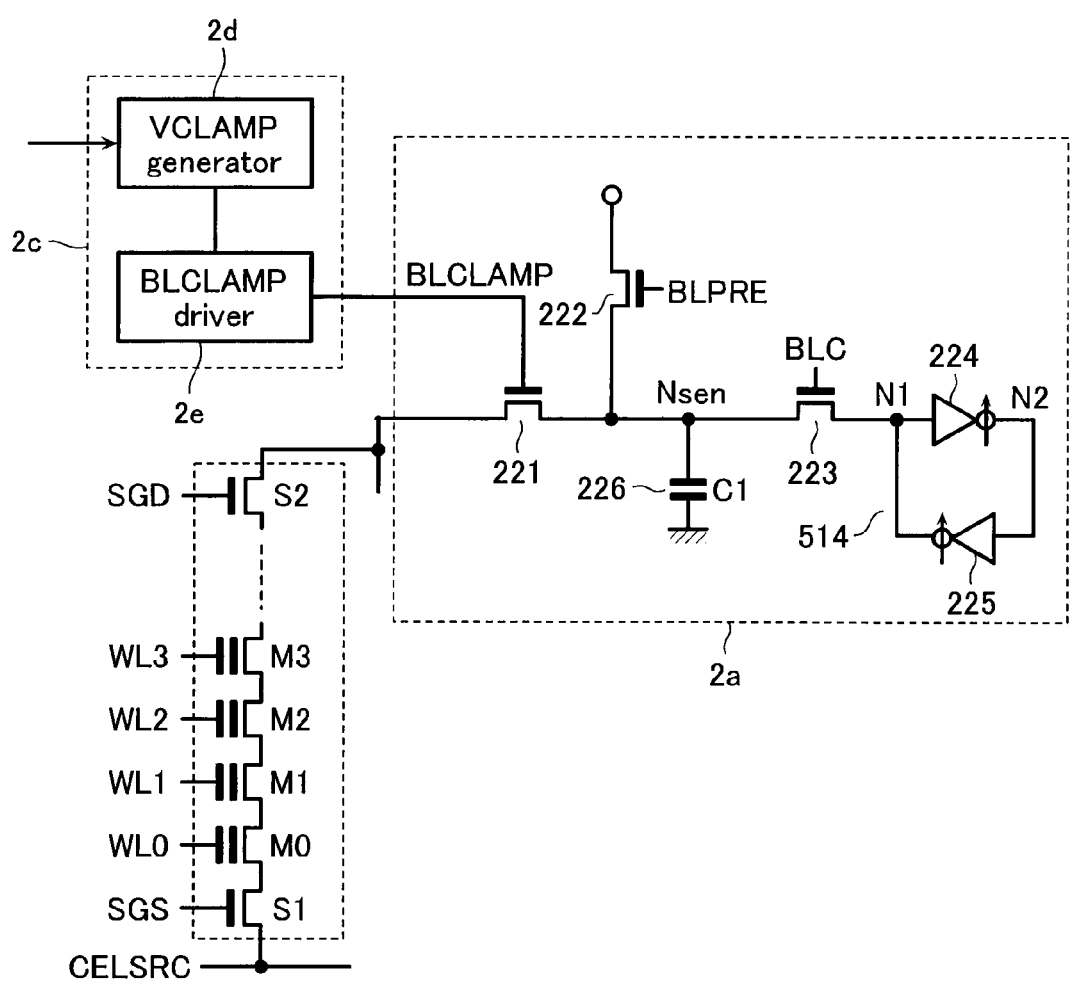

FIG. 4 illustrates a structure of the page buffer circuit 2a. The page buffer circuit 2a includes a latch circuit 514 in which clocked inverters 224 and 225 are inverse-parallel connected to each other.

The latch circuit 514 includes two data node N1 and N2. The data node N1 serves as an input node of the clocked inverter 24, and as a node to which data is transferred from the bit line BL.

The node N1 is connected to a sense node Nsen via a transferring NMOS transistor 223. The sense node Nsen is connected to the bit line BL through a clamp NMOS transistor 221.

The clamp transistor 221 has a function of clamping the voltage of the bit line, and serves as a pre-sense amplifier.

Moreover, the sense node Nsen is connected to a precharge NMOS transistor 222 for precharging the sense node Nsen and the bit line BL.

The above-mentioned column voltage control circuit 2c is provided for controlling a gate voltage BLCLAMP of the clamp transistor 221. The column voltage control circuit 2c comprises a voltage generation circuit 2d that generates a clamp voltage Vclamp, and a driver 2e for driving the transistor 221 with the clamp voltage Vclamp.

In the data read mode, the data from the selected page in the memory cell array 1 is read to the page buffer circuit 2a. The data read to the page buffer circuit 2a is serially output to data lines DIO0-DIO7 per 1 byte, through the column gate circuit 2b selected sequentially by column selection signals CSLi, and then supplied to external input/output terminals I/00-I/07 through the data input/output buffer 6.

In the data write mode, write data is serially input from the input/output terminals I/O per 1 byte, and the write data of one page is loaded to the page buffer circuit 2a. This one-page write data is simultaneously written in the selected page in the memory cell array 1.

Moreover, the fail bit counter 9 is connected to the page buffer circuit 2a in the column control circuit 2, and serves to detect the number of "0" data or "1" data stored in the page buffer circuit 2a. In other words, the fail bit counter 9 performs fail bit number detection based on the judgment result of the verify judgment circuit included in the page buffer circuit 2a.

The number of the fail bits detected by the fail bit counter 9 is transferred to the memory controller 22 through the data input/output buffer 6, in response to a command provided from the memory controller 22 to the command address interface 7. The number of the fail bits is transferred to the memory controller 22 as status information of the memory cells. The memory controller 22 properly switches, based on the number of the fail bits as the status information, the control signals to be output to the memory chip 21.

Figure 5:
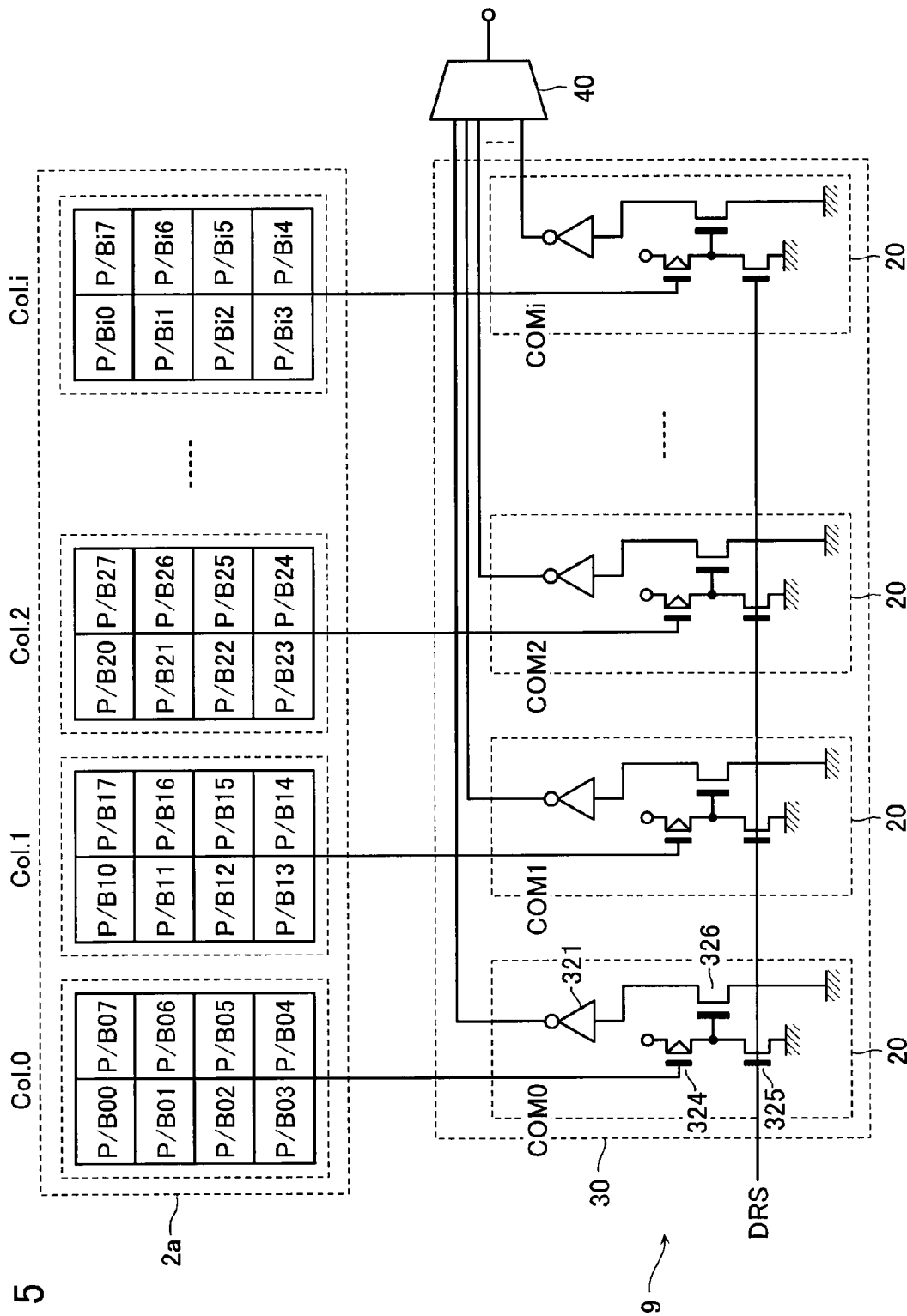
FIG. 5 is a circuit diagram showing the specific structure of the fail bit counter 9.
Figure 6:
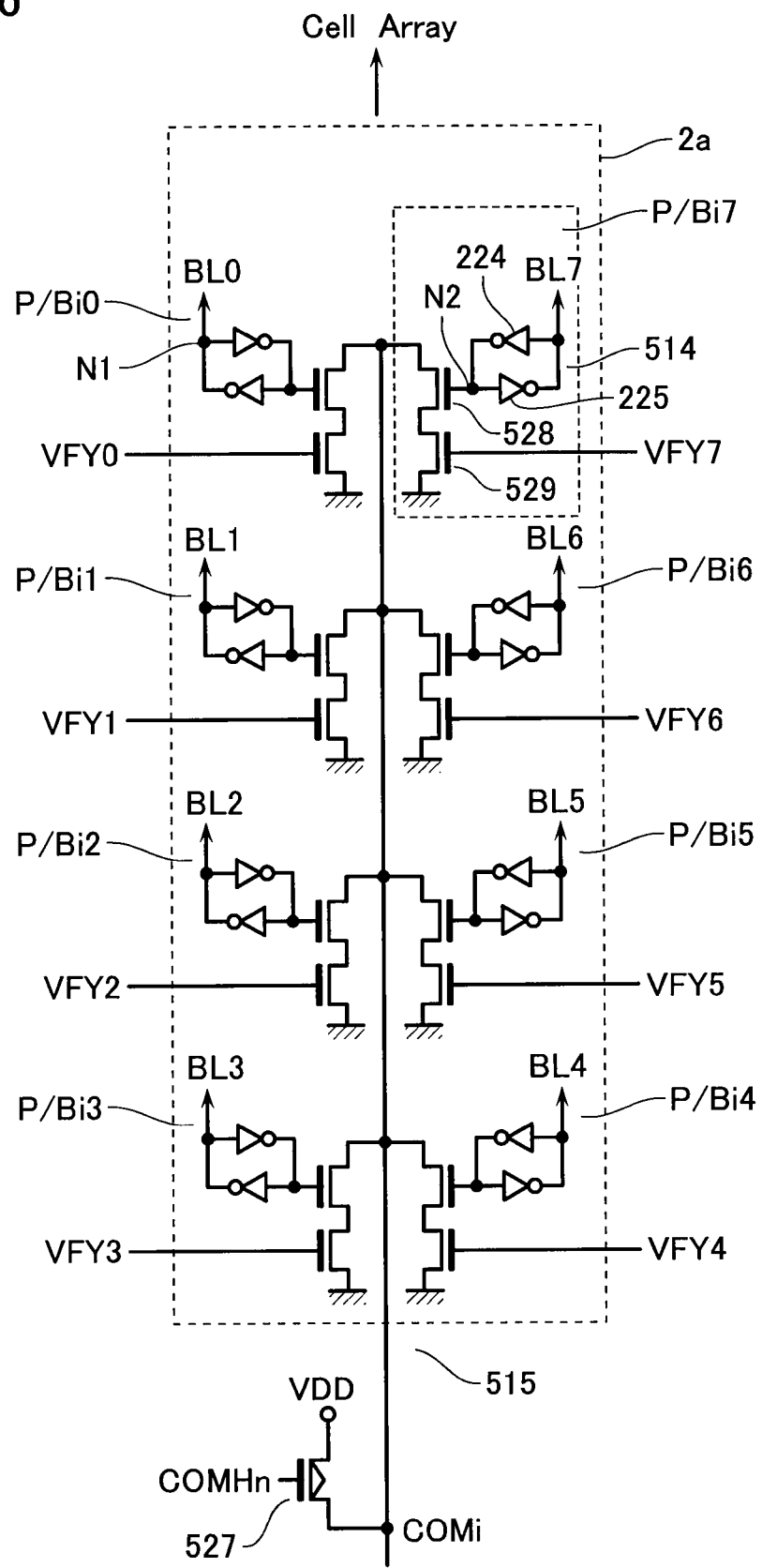
FIG. 6 is a circuit diagram showing the specific structure of the fail bit counter 9.

A specific structure of the fail bit counter 9 is illustrated in FIG. 5 and FIG. 6. FIG. 5 shows a structure of the fail bit counter 9 that counts the number of fail bits in the column Col.i, based on verify judgment signal lines COM0-COMi. The verify judgment signal lines COM0-COMi are provided for respective columns in the page buffer circuit 2a. FIG. 6 illustrates a structure of the verify judgment circuit 515, focusing on sense amplifiers P/Bi0-P/Bi7 in one column.

As shown in FIG. 5, the fail bit counter 9 comprises a voltage detection circuit 30 and logic gate 40. The voltage detection circuit 30 comprises detection units 20. Each of the detection units 20 is provided for each column Col.i. Each of the detection units 20 includes a inverter 321, a PMOS transistor 324, an NMOS transistor 325 and 326. Also, each of the detection units 20 is connected to the verify judgment signal line COMi, respectively.

The PMOS transistor 324 has a source supplied with a certain the power source voltage, a drain connected to a drain of the NMOS transistor 325, and a gate connected to the verify judgment signal line COMi. The NMOS transistor 325 has a source that is grounded. Moreover, the MOS transistor 325 has a source provided with a signal DRS which is "H" when the fail bit counter 9 is in operation. Moreover, the NMOS transistor 326 has a gate connected to a connection node between the transistors 324 and 325, or the drain of the PMOS transistor 324. A source of the NMOS transistor 326 is grounded, and a drain thereof is connected to an input terminal of the inverter 321.

The logic gate 40 has an input terminal supplied with output signals of the inverters 321, and outputs a status signal indicating the number of the fail bits per column Col.i.

As shown in FIG. 6, the verify judgment circuit 515 includes an NMOS transistor 528, an NMOS transistor 529, and a verify judgment signal line COMi. Each of the sense amplifiers P/Bij includes a latch circuit 514 therein, and the latch circuit 514 includes inverters 224 and 225. The latch circuit 514 has a data node N2 therein, and the data node N2 is connected to a gate of the NMOS transistor 528. The NMOS transistor 529 serves to activate the NMOS transistor 528. The verify judgment signal line COMi is connected in common to drains of the NMOS transistors 528 in the sense amplifiers P/Bij.

The verify judgment signal line COMi is connected in common to eight latch circuits 514 in each column Col.i. For example, one page is configured by 8*66=528 bits, and judgment signal lines COMi (i=0–65) for 66 columns are disposed therein. Another data node N1 in the each latch circuit 514 is connected to the bit line BL. A precharge PMOS transistor 527 is connected to the verify judgment signal line COMi for precharging the verify judgment signal line COMi to "H" level prior to the verify judgment. Moreover, control signals VFY0-VFY7 are input to respective gates of the NMOS transistors 529 in each of the sense amplifier P/Bi0-P/Bi7, in order to detect a state of data (one page or 528 bits) stored in the page buffer circuit 2a. These control signals VFY0-VFY7 are used in common for fail-bit judgment at all columns Col.i (i.e., 66 columns).

At the time of the fail bit detection operation, signal line COMi is precharged to "H" level (=VDD) by the PMOS transistor 527. Thereafter, either of the control signals VFY0-VFY7 is made "H". For example, when the control signal VFY0 is made "H", PASS/FAIL judgment is performed simultaneously at 66 sense amplifiers P/Bi0, based on data at the node N2. That is, it is assumed here that the node N2 becomes "L" when verify read result is "Pass". Also, it is assumed here that the node N2 becomes "H" when verify read result is "Fail". In this case, in a "Pass" sense amplifier, the transistor 528 keeps an off state, and the signal line COMi is not discharged. In contrast, in a "Fail" sense amplifier, the signal line COMi is discharged through electrical paths of the NMOS transistors 528 and 529, thereby the electric potential of the signal line COMi being lowered.

Precharging the judgment signal lines COMi, and sequentially switching either one of the control signals VFY1-7 to "H" is repeated, thereby "Pass" or "fail" of the 528-bit sense amplifier data (66*8=528 bits) may be judged in the logic gate 40. The logic gate 40 gathers the result of the judgment, and the number of the fail bits for each column is determined, and is output as a status signal.

In FIG. 2, the number of the fail bits from the fail bit counter 9 is output as a result of a fail bit output command provided from the controller 22 to the command address interface 7 in the memory chip 21, and is output to the memory controller 22 through a data input/output buffer in a data bus.

The fail bit output command provided from the memory controller 22 to the command address interface 7 in the chip is supplied to the multiplexer 10 as a selection control signal. Then, the number of the fail bits from the fail bit counter 9 is output to the memory controller 22 through the data input/output buffer 6. The control signal section 31 in the memory controller 22 outputs a control signal for data write, data read and data erasure to the memory chip 21 according to an instruction from a host device (not shown).

However, when a certain status signal is provided from the fail bit counter 9, the control signal switching section 32 orders the control signal section 31 to switch the control signals. This allows the column voltage control circuit 2c to change the clamping voltage of the transistor 221d. Thus, the clamping voltage is controlled independently for each column Col depending on the number of fail bits, and the precharge voltage of the bit line BL can be changed depending on the number of fail bits for each column. This allows a memory cell that is judged as "Fail" to be dealt as "Pass". As a result, a reliability of the memory can be improved.

Second Embodiment

Next, the second embodiment of the present invention is described with reference to FIG. 7. Since the entire structure of the semiconductor storage system according to this embodiment is similar to that shown in FIG. 1, FIG. 2, the detailed description thereof is omitted hereinbelow.

This embodiment is different from the first embodiment in an operation after the data write to the memory cell is performed, and thereafter the status signal is provided from the memory chip 21. FIG. 7 is a flowchart showing the operation in this embodiment.

First, the memory controller 22 receives, from a host device not shown, a write command, a logic address of the memory cell to be written in the memory chip 21, and data to be written (S11).

Then the memory controller 22 determines, based on the information (cell-property information) about the memory cell MC stored in the RAM 28, a physical address of the memory cell to be written (a chip number, a block, and a page), and further determines the control voltage (the initial value of the write voltage, a step-up level thereof, and a write verify voltage) (S12).

Subsequently, a control signal indicating a write command, an address, data, and the write control voltage is transferred to the memory chip 21 to be written (S13). In response to the control signal, the memory chip 21 performs data write with regard to the specified address using the indicated write control voltage (S14). After executing the data write, a status signal about the writing is transmitted to the memory controller 22 (S15). Note that, status information included in the status signal may include the number of fail bits, as explained in the first embodiment. Other types of the status information may include:

a busy signal indicating the write/erase operation is being carried out;

the number of times the write/erase pulse voltage is applied; and

Pass/Fail information in the verify operation.

Moreover, a piece of status information may be defined for entire memory chip 21. It may be defined for the plane shown in FIG. 2. Alternatively, the status information may be divided into smaller groups. Specifically, the status information may be generated and provided to the memory controller 22 per block or per page.

The memory controller 22 confirms, based on a status signal, the status of the memory chip 21 (S16). Then, it performs any one of four methods explained below in accordance with the status.

Specifically, when the status belongs to a first state that data write has been carried out comparatively well, the memory controller 22 performs the control so that a write verify voltage for confirming the completion of the data write after execution of data write, and the process goes back to Step S13 (S17).

When the status belongs to a second state worse than the first state in view of the extent of data write completion, the memory controller 22 performs a control for reducing the number of bits of data written in a memory cell that is formed along the selected word line or in the selected block, after the execution of data write. For example, the number of bits per memory cell is reduced to two-value data (1 bit/cell) from four-value data (2 bits/cell) (S18).

When the status belongs to a third state that is worse than the second state, the usage of the memory cell on the selected word line (or in the selected block) is prohibited after execution of the data write (S19).

When the status of the data write is judged as good (no problem) as a result of confirmation of the status, the status information may be stored in the RAM 28 in the memory controller 22, for example. In addition, cell property information obtained from the status information is also stored in the RAM28, as needed (S20).

In this way, depending on a status of data write, the write operation to the memory cell can be changed. When there is a plurality of memory chips 21, different control can be performed for respective memory chips, and, besides, a plurality of memory chips 21 can be controlled by a single memory controller 22.

Figure 7:
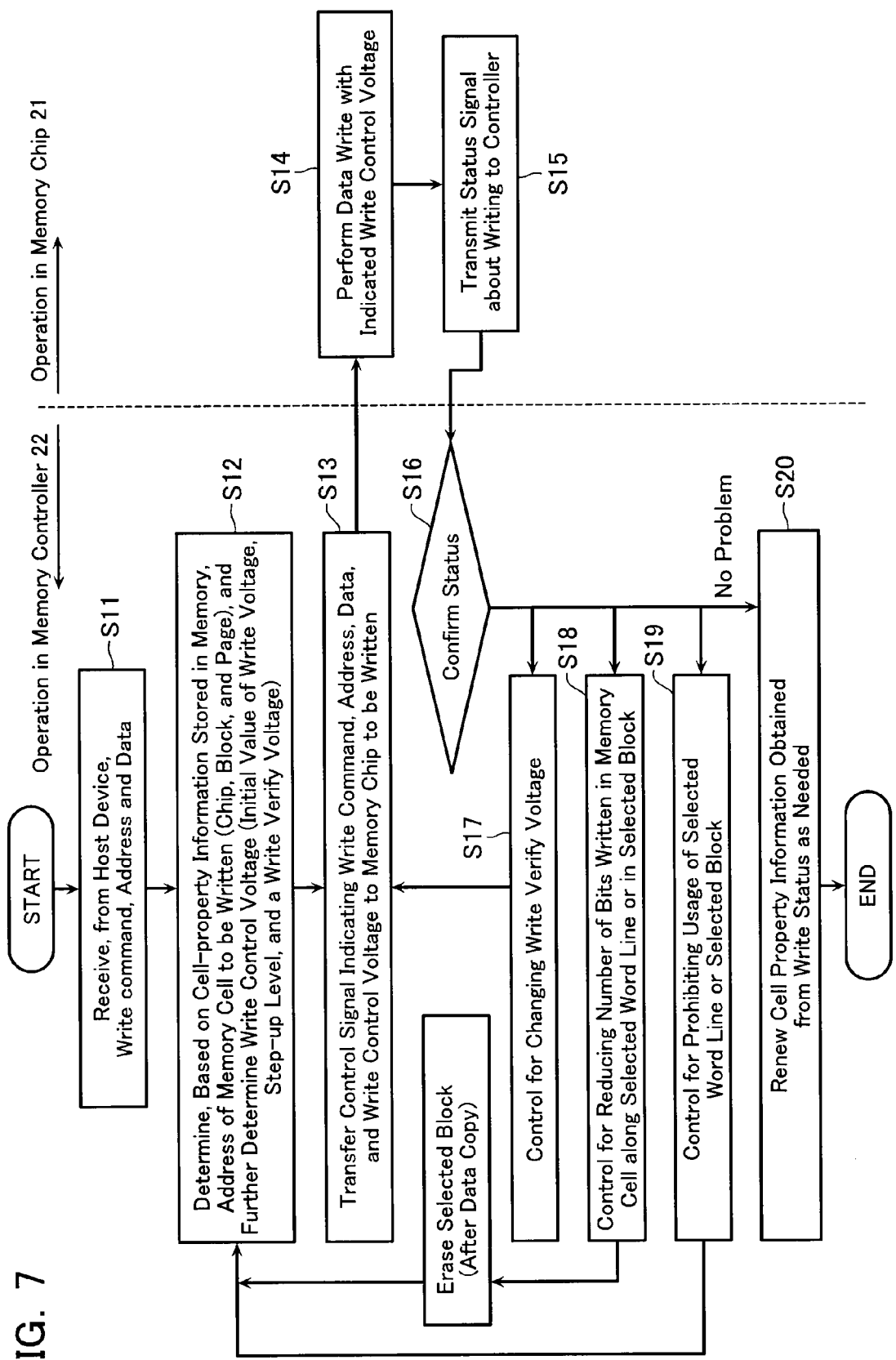
FIG. 7 is a flowchart explaining operations of the second embodiment of the present invention.
Figure 8:
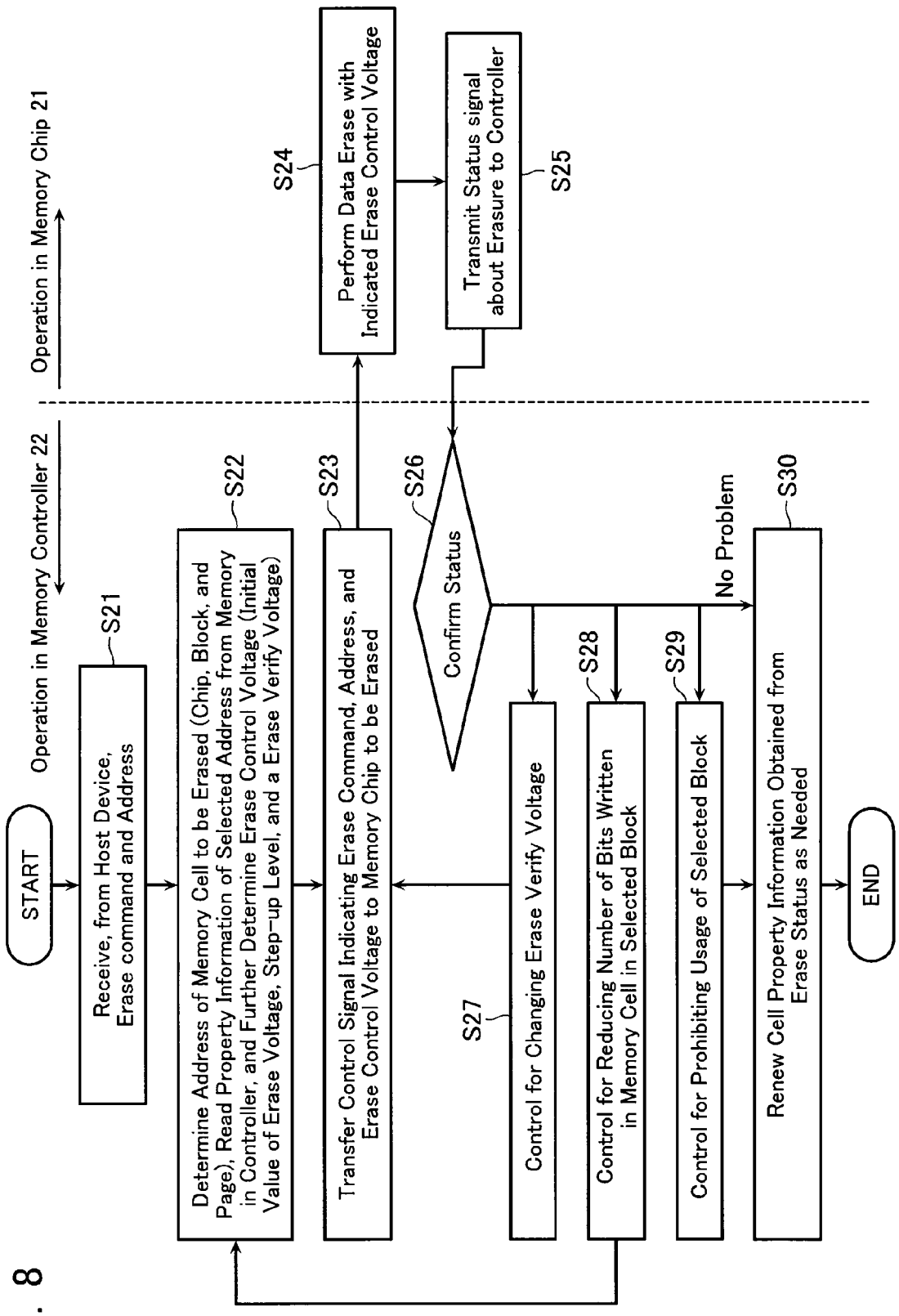
FIG. 8 is a flow chart showing operations of the second embodiment of the present invention.
Figure 9:
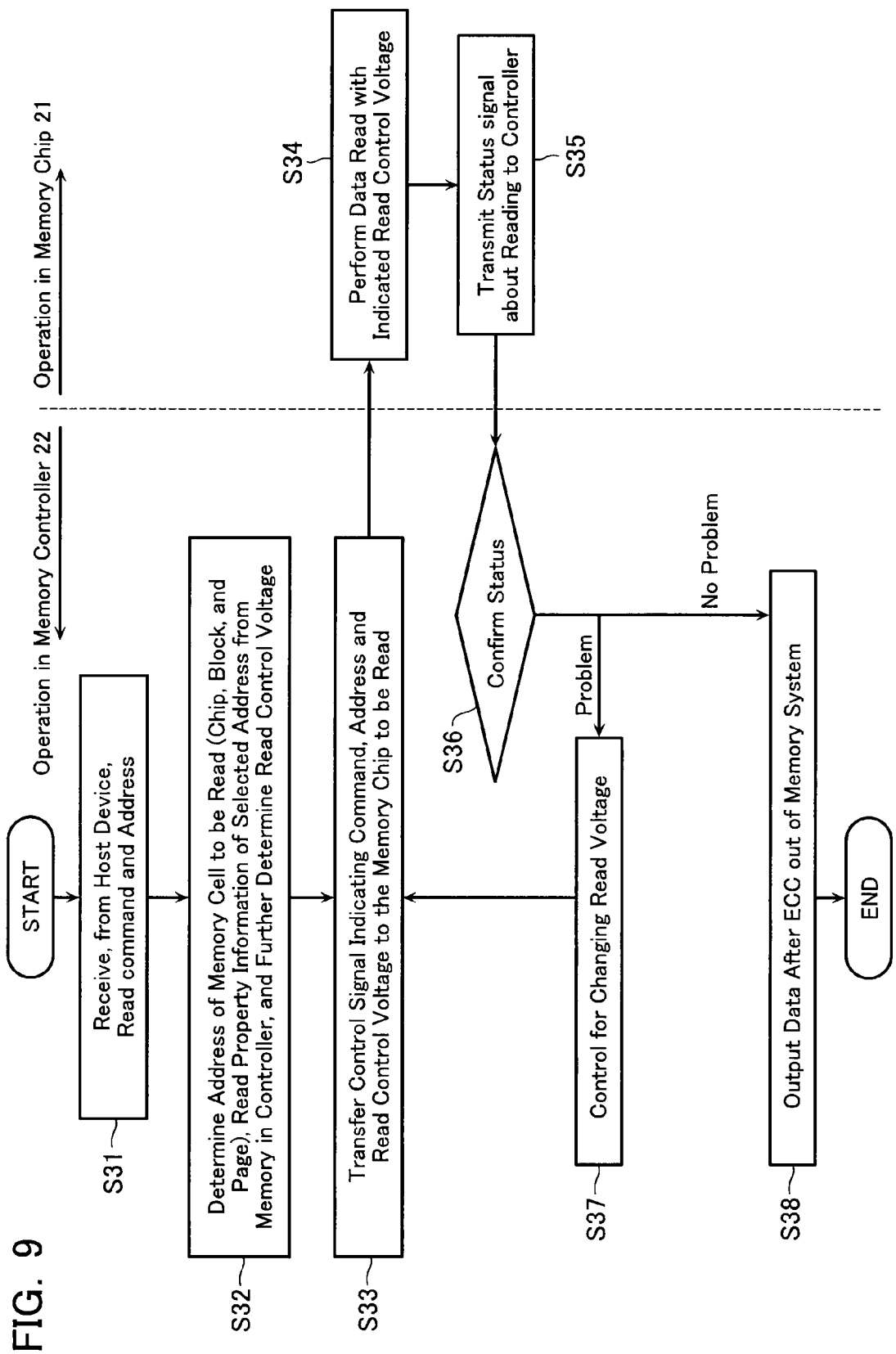
FIG. 9 is a flow chart showing operations of the second embodiment of the present invention.

Note that although FIG. 7 illustrates the case of the data write, a similar method can be applied when data erase operation is performed, as shown in FIG. 8. Moreover, even when data read is performed, status information may be received from the memory chip 21, and as shown in FIG. 9 for example, a setup may be changed depending on the status information so that the read voltage may be changed when there is any problem (S37). If there is no problem, it is possible to output data after the error correction (ECC) out of the memory system (a host device or the like) and the whole operation may be finished. Other similar operation may be employed instead.

Having explained embodiments of the present invention, the present invention is not limited to the specific embodiments. It will be understood by those skilled in the art that various changes in form and detail, addition may be made therein without departing from the spirit and scope of the invention.

What is claimed is:

1. A non-volatile semiconductor memory system, comprising:
    a non-volatile memory comprising a memory cell array with electrically-rewritable non-volatile memory cells arranged therein; and
    a controller configured to control operation in the non-volatile memory,
    the non-volatile memory comprising a status output section configured to output status information indicating a status of read operation, write operation or erase operation in the non-volatile memory cell,
    the controller comprising
    a control signal generating section configured to output a control signal for a certain operation in the non-volatile memory, and
    a control signal switching section configured to instruct the control signal generating section to switch the control signal based on the status information.

2. The non-volatile semiconductor memory system according to claim 1, wherein
    the status output section outputs the number of fail bits at the time of data write or the data erase, and
    the control signal switching section switches the control signal based on the number of fail bits.

3. The non-volatile semiconductor memory system according to claim 2, wherein
the status output section outputs the number of fail bits for a certain region in the memory cell array,
the control signal switching section switches the control signal for the certain region in accordance with the number of fail bits in the certain region.

4. The non-volatile semiconductor memory system according to claim 3, further comprising a voltage control circuit operative to switch a magnitude of the voltage applied to the memory cell, in accordance with a instruction from the control signal switching section, the voltage control circuit being provided for the certain region.

5. The non-volatile semiconductor memory system according to claim 1, wherein the control signal generating section generates a control signal for indicating a voltage to be applied to the memory cell for data write, data erase, or data read.

6. The non-volatile semiconductor memory system according to claim 5, wherein
the status output section outputs the number of fail bits at the time of data write or data erase, and
the control signal switching section changes the control signal based on the number of fail bits.

7. The non-volatile semiconductor memory system according to claim 6, wherein the status output section outputs the number of fail bits for a certain region in the memory cell array, and
the control signal switching section switches the control signal for the certain region in accordance with the number of fail bits in the certain region.

8. The non-volatile semiconductor memory system according to claim 7, further comprising a voltage control circuit operative to switch a magnitude of the voltage applied to the memory cell, in accordance with a instruction from the control signal switching section, the voltage control circuit being provided for the certain region.

9. The non-volatile semiconductor memory system according to claim 1, wherein the control signal switching section changes the control signal based on the status information so that an operation for the non-volatile memory is changed.

10. The non-volatile semiconductor memory system according to claim 9, wherein
the status output section outputs the number of fail bits at the time of data write or the data erase, and
the control signal switching section switches the control signal based on the number of fail bits.

11. The semiconductor memory system according to claim 10, wherein
the status output section outputs the number of fail bits for a certain region in the memory cell array, and
the control signal switching section switches the control signal for the certain region in accordance with the number of fail bits in the certain region.

12. The non-volatile semiconductor memory system according to claim 11, further comprising a voltage control circuit operative to switch a magnitude of the voltage applied to the memory cell, in accordance with a instruction from the control signal switching section, the voltage control circuit being provided for the certain region.

13. The non-volatile semiconductor memory system according to claim 1, wherein the control signal switching section changes the control signal so that a magnitude of a write verify voltage at a write verify operation performed after conducting a write operation for the memory cell.

14. The non-volatile semiconductor memory system according to claim 1, wherein the control signal switching section changes the control signal so that the number of bits of data written in one of the memory cells are changed.

15. The non-volatile semiconductor memory system according to claim 1, the control signal switching section prohibits usage of the memory cell relating to the status information.

16. The non-volatile semiconductor memory system according to claim 1, wherein the status information includes at least any one of: the number of fail bits for a certain region in the memory cell array; a busy signal indicating that a certain operation is in execution; the number of times the a write/erase pulse voltage is applied; and Pass/Fail information at a verify operation.

17. The non-volatile semiconductor memory system according to claim 1, wherein the controller includes a memory unit for storing cell property information relating to a property of the memory cell, and the control signal generation unit generates the control unit in accordance with the cell property information.

18. The non-volatile semiconductor memory system according to claim 17, wherein
the status output section outputs the number of fail bits at the time of data write or data erase, and
the control signal switching section changes the control signal based on the number of fail bits.

19. The non-volatile semiconductor memory system according to claim 18, wherein the status output section outputs the number of fail bits for a certain region in the memory cell array, and
the control signal switching section switches the control signal for the certain region in accordance with the number of fail bits in the certain region.

20. The non-volatile semiconductor memory system according to claim 19, further comprising a voltage control circuit operative to switch a magnitude of the voltage applied to the memory cell, in accordance with a instruction from the control signal switching section, the voltage control circuit being provided for the certain region.

21. The non-volatile semiconductor memory system according to claim 2, wherein
the control signal switching section switches the control signal for changing a write verify voltage for verifying completion of a write operation.

22. The non-volatile semiconductor memory system according to claim 2, wherein
the control signal switching section switches the control signal for reducing the number of bits written in one memory cell.

23. The non-volatile semiconductor memory system according to claim 2, wherein
the control signal switching section switches the control signal for changing an erase verify voltage for verifying completion of an erase operation.

24. The non-volatile semiconductor memory system according to claim 2, wherein the status output section is configured to output information on the number of fail bits by a command.

25. The non-volatile semiconductor memory system according to claim 1, wherein
the status output section outputs the number of fail bits at the time of data read, and
the control signal switching section switches the control signal based on the number of fail bits.

26. The non-volatile semiconductor memory system according to claim 25, wherein the control signal switching section switches the control signal for changing a read voltage for a reading operation.

27. The non-volatile semiconductor memory system according to claim 25, wherein the status output section is configured to output information on the number of fail bits by a command.

28. The non-volatile semiconductor memory system according to claim 1, wherein the status output section outputs the number of times a write pulse voltage or an erase pulse voltage is applied, and the control signal switching section switches the control signal based on the number of times a write pulse voltage or an erase pulse voltage is applied.

29. The non-volatile semiconductor memory system according to claim 28, wherein the status output section is configured to output information on the number of times a write pulse voltage or an erase pulse voltage is applied by a command.

* * * * *